United States Patent
Liu et al.

(10) Patent No.: US 11,876,147 B2
(45) Date of Patent: Jan. 16, 2024

(54) ENHANCED DOPING EFFICIENCY OF ULTRAWIDE BANDGAP SEMICONDUCTORS BY METAL-SEMICONDUCTOR ASSISTED EPITAXY

(71) Applicant: THE REGENTS OF THE UNIVERSITY OF MICHIGAN, Ann Arbor, MI (US)

(72) Inventors: Xianhe Liu, Ann Arbor, MI (US); Ayush Pandey, Ann Arbor, MI (US); Zetian Mi, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 671 days.

(21) Appl. No.: 16/424,157

(22) Filed: May 28, 2019

(65) Prior Publication Data

US 2019/0363218 A1    Nov. 28, 2019

Related U.S. Application Data

(60) Provisional application No. 62/838,842, filed on Apr. 25, 2019, provisional application No. 62/676,828, filed on May 25, 2018.

(51) Int. Cl.
*H01L 33/00* (2010.01)
*H01L 33/06* (2010.01)
*H01L 33/32* (2010.01)

(52) U.S. Cl.
CPC ........ *H01L 33/007* (2013.01); *H01L 33/0025* (2013.01); *H01L 33/06* (2013.01); *H01L 33/325* (2013.01)

(58) Field of Classification Search
CPC .................. H01L 33/007; H01L 33/325
See application file for complete search history.

(56) References Cited

U.S. PATENT DOCUMENTS

6,001,173 A * 12/1999 Bestwick .............. H01L 33/007
117/103
6,953,740 B2    10/2005 Schaff et al.
(Continued)

FOREIGN PATENT DOCUMENTS

JP    2005032823 A  *  2/2005
WO   2012012010       1/2012

OTHER PUBLICATIONS

Liang Y H et al.: Heavy Mg-Doping of (Al, Ga) N films for potential applications in deep ultraviolet light-emitting structures; Journal of Applied Physics, American Institute of Physics, 2 Huntington Quadrangle, Melville, NY 11747, vol. 123, No. 9, Mar. 5, 2018.
(Continued)

*Primary Examiner* — Michele Fan

(57) ABSTRACT

An epitaxial growth process, referred to as metal-semiconductor junction assisted epitaxy, of ultrawide bandgap aluminum gallium nitride (AlGaN) is disclosed. The epitaxy of AlGaN is performed in metal-rich (e.g., Ga-rich) conditions using plasma-assisted molecular beam epitaxy. The excess Ga layer leads to the formation of a metal-semiconductor junction during the epitaxy of magnesium (Mg)-doped AlGaN, which pins the Fermi level away from the valence band at the growth front. The Fermi level position is decoupled from Mg-dopant incorporation; that is, the surface band bending allows the formation of a nearly n-type growth front despite p-type dopant incorporation. With controlled tuning of the Fermi level by an in-situ metal-semiconductor junction during epitaxy, efficient p-type conduction can be achieved for large bandgap AlGaN.

20 Claims, 13 Drawing Sheets

(56) References Cited

U.S. PATENT DOCUMENTS

| | | |
|---|---|---|
| 7,498,182 B1 | 3/2009 | Sampath et al. |
| 2007/0080369 A1* | 4/2007 | Sakai .................... H01L 33/007 |
| | | 257/E33.003 |
| 2008/0157102 A1 | 7/2008 | Hori et al. |
| 2009/0141765 A1* | 6/2009 | Kohda ................ H01S 5/34333 |
| | | 372/45.012 |
| 2009/0206320 A1 | 8/2009 | Chua et al. |

OTHER PUBLICATIONS

Cho Yongjin et al.: "Single-Crystal N-polar GaNp-ndiodes by plasma-assisted molecular beam epitaxy"; Applied Physics Letters, American Institute of Phyiscs, 2 Huntington Quadrangle, Melville, NY 11747, vol. 110, No. 25, Jun. 21, 2017.

McLaurin M et al: "Molecular-beam epitaxy of p-type m-plane GaN"; Applied Physics Letters, American Institute of Physics, 2 Huntington Quadrangle, Melville, NY 11747, vol. 86, No. 26, Jun. 22, 2005, pp. 262104-262104.

* cited by examiner

ENHANCED DOPING EFFICIENCY OF ULTRAWIDE BANDGAP SEMICONDUCTORS BY METAL-SEMICONDUCTOR ASSISTED EPITAXY

RELATED U.S. APPLICATIONS

This application claims priority to U.S. Provisional Patent Application No. 62/838,842, by Liu et al., entitled "Enhanced Doping Efficiency of Ultrawide Bandgap Semiconductors by Metal-Semiconductor Assisted Epitaxy," filed Apr. 25, 2019, and also claims priority to U.S. Provisional Patent Application No. 62/676,828, by Liu et al., entitled "Doped AlGaN Grown by Molecular Beam Epitaxy," filed May 25, 2018.

BACKGROUND

Wide bandgap semiconductors such as gallium nitride (GaN), aluminum nitride (AlN), and their alloys have emerged as the materials of choice for high power and high frequency electronic devices, as well as for a broad range of photonic devices including ultraviolet (UV) light emitting diodes (LEDs), lasers, and solar blind photodetectors. Ultra-wide bandgap semiconductors are important for a broad range of electronic and photonic devices, but their practical application has been limited by poor current conduction.

Precise control of the doping level in the different layers of the device structure is critical for the operation and performance of these devices. To date, however, it has remained extremely challenging to achieve efficient p-type conduction of AlN and AlGaN with relatively high Al content, which has been identified as one of the major obstacles to realizing high performance optoelectronic devices operating in the mid and deep UV spectra.

Magnesium (Mg) has been established as the only viable p-type dopant of group III-nitride semiconductors. However, it exhibits very large activation energy (up to 500-600 meV) in Al-rich AlGaN, severely limiting the doping efficiency and the realization of large hole concentration at room temperature. The solubility of Mg acceptor dopant in AlGaN also decreases significantly with increasing Al concentration. Moreover, the formation energies for donor-like defects, including nitrogen vacancies ($V_N$ and $V_N^{3+}$), are significantly reduced with increased Mg dopant incorporation, which leads to a strong self-compensation effect.

For AlGaN with Al compositions of approximately 50-60%, the achievement of efficient p-type conduction is further compromised by the formation of large densities of defects and dislocations, due to the relatively large lattice mismatch between AlN and GaN and with the commonly available substrates. Previously, the epitaxy of Mg-doped AlGaN has been extensively studied by using metal-organic chemical vapor deposition (MOCVD). The reported free hole concentrations for Al-rich AlGaN epilayers varied from $10^{15}$ to $10^{17}$ cm$^{-3}$ at room temperature. Improved hole concentrations have been reported by using delta-doping, short period superlattice, polarization-induced doping, metal-modulated epitaxy, and indium surfactant, but with low mobility values on the order of 1-3 cm$^2$/(V·s) for Al-rich AlGaN at room temperature. As a consequence, resistivity values in the range of a few or tens of Ω·cm have been commonly measured for AlGaN epilayers with Al compositions in the ranges of 60-70%, compared to less than one Ω·cm for p-type GaN.

Extensive studies have been performed to realize low-resistivity p-type AlGaN, including the use of a high V/III ratio to suppress formation of compensating nitrogen vacancies, superlattices consisting of alternating AlGaN layers, metal modulation epitaxy (MME), Mg delta-doping, indium as a surfactant, and polarization-induced doping, but with limited success. For example, the lowest resistivity reported for p-type Al$_{0.85}$Ga$_{0.15}$N epilayers to date is well over $10^3$ Ω·cm, which is more than three orders of magnitude larger than that of Mg-doped GaN.

SUMMARY

To achieve p-type aluminum gallium nitride (AlGaN) with large hole concentration and low resistivity, it is essential to incorporate large densities of magnesium (Mg)-dopant atoms. At very large concentrations (~$10^{19}$-$10^{20}$ cm$^{-3}$), an Mg impurity band is expected to form, which enables hole hopping conduction. Moreover, the significantly broadened acceptor energy levels at large Mg-doping concentrations, together with the band tailing effect, also reduces the ionization energy for a fraction of Mg-dopants. In practice, however, it becomes more difficult to incorporate Mg into AlGaN with increasing Al concentration, due to the larger formation enthalpy (lower solubility) for Mg substituting Al in the AlGaN lattice sites, compared to Ga. Theoretical calculations confirm the difficulty in substitutional Mg incorporation, especially in Al sites. The formation energy for various compensating point defects also depends critically on the position of the Fermi level. During conventional epitaxy, with Mg-dopant incorporation, the Fermi level shifts towards the valence band edge, which significantly reduces the formation energy for carbon, oxygen, and nitrogen vacancies. These defects have a strong compensating effect and further degrade the structural, electronic, and optical properties of Mg-doped AlGaN. In addition, the formation energy of N-substitutional and interstitial Mg incorporation decreases drastically with Mg incorporation, and becomes comparable to that of Al(Ga)-substitutional Mg incorporation when the Fermi level is positioned close to the valence band edge, further limiting the doping efficiency and the achievement of large hole concentrations.

Critical issues for achieving efficient p-type conduction of AlGaN can be addressed if the Fermi level at the growth front can be tuned away from the valence band during the epitaxy of p-type (e.g., Mg-doped) AlGaN.

Embodiments according to the present disclosure achieve this and overcome the challenges described above with a novel epitaxial growth process, referred to herein as metal-semiconductor junction assisted epitaxy. With metal-semiconductor junction assisted epitaxy, molecular beam epitaxy (MBE) is used to form a liquid metal layer on the growth interface during epitaxy, to enhance dopant incorporation and curtail the formation of compensating defects.

Metal-semiconductor junction assisted epitaxy has been demonstrated for the growth of Mg-doped AlGaN epilayers. In these embodiments, the epitaxy of AlGaN is performed in metal-rich (e.g., Ga-rich) conditions using, for example, plasma-assisted MBE. The excess Ga layer leads to the formation of a metal-semiconductor junction during the epitaxy of Mg-doped AlGaN, which pins the Fermi level away from the valence band at the growth front. In embodiments, the Ga layer is conformal across the surface during growth and a Ga thickness of approximately 0.5 nm is determined to be present on the growth surface during epitaxy. The thickness of Ga layer, however, may be larger. During metal-semiconductor junction assisted epitaxy, the presence of the excess Ga layer creates a separation between the Fermi level and the valence band. In this novel epitaxy process, the Fermi level position is decoupled from Mg-dopant incorporation; that is, the surface band bending allows the formation of a nearly n-type growth front despite p-type dopant incorporation, which is in direct contrast to the fixed Fermi level position near the valence band edge during conventional epitaxy of Mg-doped AlGaN. As such, the formation energy for substitutional Mg is dramatically reduced, even when very large densities of Mg-dopant atoms are incorporated, while simultaneously increasing the formation energy for compensating defects. For example, the separation between the Fermi level and valence band increases from approximately 0.12 eV during conventional epitaxy of Mg-doped $Al_{0.5}Ga_{0.5}N$ to approximately 2.2 eV using metal-semiconductor junction assisted epitaxy.

The role of Fermi-level tuning at the growth front and the resulting effect on the enhanced substitutional incorporation of Mg and suppressed compensating defect formation during epitaxy of AlGaN under metal-rich conditions has not been identified previously.

By increasing the separation between the Fermi level and valence band, the formation energy is reduced to only approximately 0.43 eV for metal-semiconductor junction assisted epitaxy of $Al_{0.5}Ga_{0.5}N$, which is about 1.6 eV lower than that during growth using conventional epitaxy. The disclosed method utilizes the spontaneous formation of a metal-semiconductor junction at the growth interface by excess Ga, and can be integrated into the fabrication system under use. In the growth regime, the Al composition of AlGaN can be controllably varied by tuning the Al material flux while keeping the nitrogen flow rate constant. Al—N will preferably form while any excess Ga will accumulate on the surface to form the metal-semiconductor junction during epitaxy.

Utilizing the disclosed process, Mg incorporation in AlGaN is enhanced by nearly one order of magnitude compared to a conventional growth process. For example, an Mg concentration of approximately $2 \times 10^{20}$ $cm^{-3}$ was measured in $Al_{0.75}Ga_{0.25}N$ for a moderate Mg flux of approximately $7 \times 10^{-8}$ Torr. A significant reduction of carbon impurity incorporation was also confirmed through detailed secondary ion mass spectrometry (SIMS) measurements. Significantly, a free hole concentration of approximately $4.5 \times 10^{17}$ $cm^{-3}$ was measured for $Al_{0.9}Ga_{0.1}N$, with resistivity values less than five $\Omega \cdot cm$, which is nearly three orders of magnitude lower compared to conventional techniques.

Ultraviolet 280 nm light-emitting diodes fabricated according to the disclosed embodiments demonstrate significant improvements in the device characteristics and external quantum efficiency for the samples grown by metal-semiconductor junction assisted epitaxy, as compared to the sample grown using a conventional growth mode.

As mentioned above, ultrawide bandgap semiconductors are important for a broad range of electronic and photonic devices, but their practical application has been limited by poor current conduction. With controlled tuning of the Fermi level by an in-situ metal-semiconductor junction during epitaxy as disclosed herein, efficient p-type conduction can be achieved for large bandgap AlGaN. Such a unique technique can be extended for the epitaxy/synthesis of a broad range of wide bandgap semiconductors to achieve efficient current conduction that was not previously possible.

These and other objects and advantages of the various embodiments of the present disclosure will be recognized by those of ordinary skill in the art after reading the following detailed description of the embodiments that are illustrated in the various drawing figures.

BRIEF DESCRIPTION OF DRAWINGS

The accompanying drawings, which are incorporated in and form a part of this specification, illustrate embodiments of the invention and, together with the description, serve to explain the principles of the invention. Like numbers denote like elements throughout the drawings and specification. The figures may not be drawn to scale.

DETAILED DESCRIPTION

Figure 1:
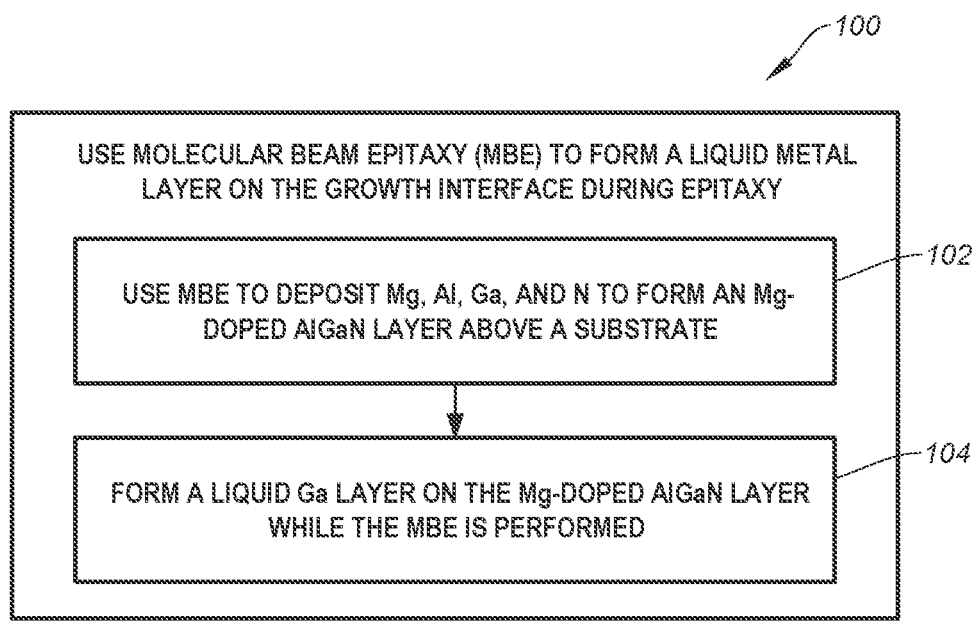
FIG. 1 is a flowchart of a method (metal-semiconductor junction assisted epitaxy) of fabricating a device in embodiments according to the present invention.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations for fabricating devices such as semiconductor devices. These descriptions and representations are the means used by those skilled in the art of device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "epitaxy," "depositing," "forming," "varying," "removing," "incorporating," or the like, refer to actions and processes of device fabrication.

Operations described as separate blocks may be combined and performed in the same process step (that is, in the same time interval, after the preceding process step and before the next process step). Also, some of the operations may be performed in a different order than the order in which they are described below. Furthermore, fabrication processes and steps may be performed along with the processes and steps discussed herein; that is, there may be a number of process steps before, in between, and/or after the steps shown and described herein. Importantly, embodiments according to the present invention can be implemented in conjunction with these other (perhaps conventional) processes and steps without significantly perturbing them. Generally speaking, embodiments according to the present invention can replace or be integrated with portions of a conventional process without significantly affecting peripheral processes and steps.

It is understood that the figures are not necessarily drawn to scale, and only portions of the devices and structures depicted, as well as the various layers that form those structures, are shown. For simplicity of discussion and illustration, the process is described for one or two devices or structures, although in actuality more than one or two devices or structures may be formed.

FIG. 1 is a flowchart of a method 100 of fabricating a device in embodiments according to the present invention. This method may be referred to as metal-semiconductor junction assisted epitaxy. In the method 100, molecular beam epitaxy (MBE) is used to form a liquid metal layer on the growth interface during epitaxy, to enhance dopant incorporation and curtail the formation of compensating defects.

Figure 2:
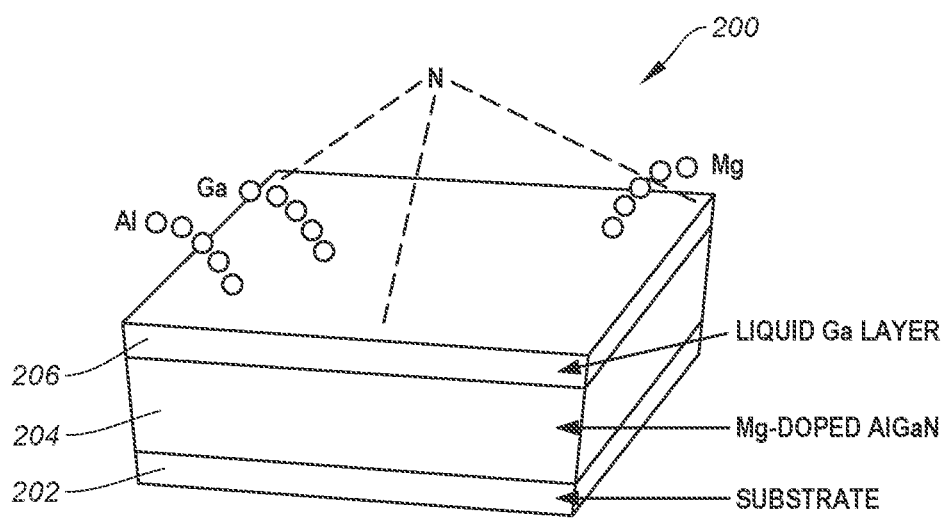
FIGS. 2 and 3 illustrate a structure (a portion of a device) formed during metal-semiconductor junction assisted epitaxy in embodiments according to the present invention.
Figure 3:
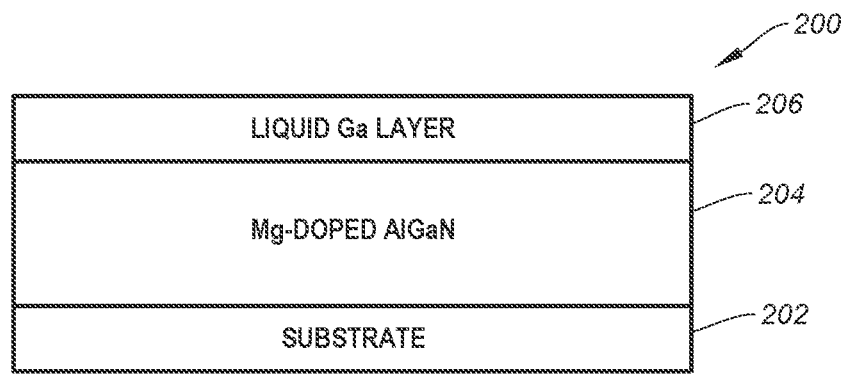

FIGS. 2 and 3 illustrate a structure 200 (a portion of a device) formed during metal-semiconductor junction assisted epitaxy, with the presence of a liquid gallium (Ga) layer on the surface during epitaxy of a magnesium (Mg)-doped AlGaN layer, in embodiments according to the present invention.

In block 104 of FIG. 1, with reference also to FIGS. 2 and 3, a liquid gallium layer 206 is formed on the Mg-doped AlGaN layer while the Mg, Al, Ga, and N are being deposited. The liquid gallium layer 206 causes formation of a metal-semiconductor junction during the epitaxy of the Mg-doped AlGaN layer 204. The reflection high-energy electron diffraction pattern (RHEED) is monitored to study the growth surface in situ. A dim, streaky RHEED pattern indicates a smooth, metal-rich growth surface, which was maintained throughout the growth. Growth using conventional epitaxy does not have a Ga metal layer on the surface, and in the conventional case the RHEED is typically characterized by the presence of clear segments, signifying a rough surface morphology.

In block 104 of FIG. 1, with reference also to FIGS. 2 and 3, a liquid gallium layer 206 is formed on the Mg-doped AlGaN layer while the Mg, Al, Ga, and N are being deposited. The liquid gallium layer 206 causes formation of a metal-semiconductor junction during the epitaxy of the Mg-doped AlGaN layer 204.

More specifically, during the epitaxy of the Mg-doped AlGaN layer 204, the Al composition is controlled by tuning Al flux and growth rate with N flow rate. For example, the flow rate of the N can be held constant, while the Al flux can be tuned to adjust the composition of the alloy. As AlN forms preferentially over GaN in the Mg-doped AlGaN layer, this results in an accumulation of a portion of the Ga to form the liquid Ga layer 206 on the Mg-doped AlGaN layer. In an embodiment, the flow rate of the nitrogen is 0.4 standard cubic centimeters per minute; however, the invention is not so limited and different flow rates can be used. In an embodiment, the Mg-doped AlGaN layer 204 is grown at a temperature of approximately 700° C.; however, the invention is not so limited, and the Mg-doped AlGaN layer can be grown in a broad range of temperatures.

Figure 4A:
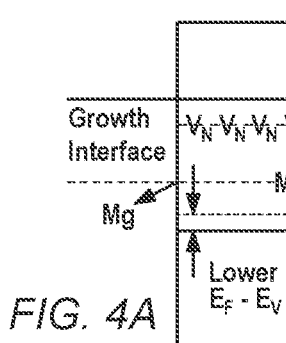
FIG. 4A illustrates the energy band diagram of a Mg-doped AlGaN layer during conventional epitaxy.

FIG. 4A illustrates the energy band diagram of a Mg-doped AlGaN layer during conventional epitaxy. The Fermi level position is decoupled from Mg-dopant incorporation; that is, the surface band bending allows the formation of a nearly n-type growth front despite p-type dopant incorporation. As such, the formation energy for substitutional Mg is dramatically reduced, even when very large densities of Mg-dopant atoms are incorporated, while simultaneously increasing the formation energy for compensating defects.

Figure 4B:
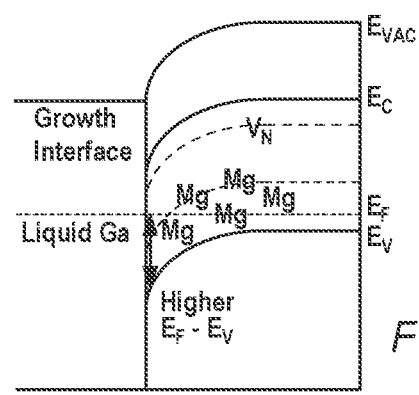
FIG. 4B illustrates the energy band diagram of a Mg-doped AlGaN layer with the formation of a metal-semiconductor junction during epitaxy that pins the Fermi level away from the valence band at the growth front, in embodiments according to the present invention.

In embodiments according to the present invention, the formation of the metal-semiconductor junction during epitaxy pins the Fermi level away from the valence band at the growth front, as shown in FIG. 4B.

Figure 4C:
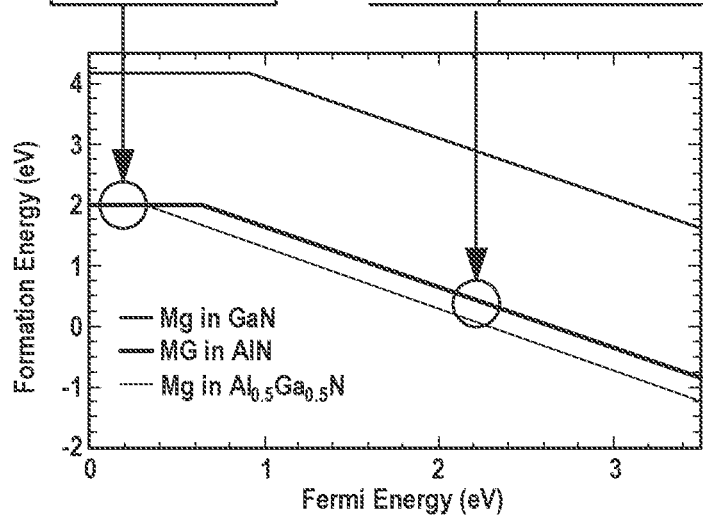
FIG. 4C illustrates calculated formation energy for Mg substitution in GaN, AlN, and $Al_{0.5}Ga_{0.5}N$ as a function of the separation between the Fermi level and the valence band with substitutional Mg formation energies for the different growth, in embodiments according to the present invention.

FIG. 4C illustrates calculated formation energy for Mg substitution in GaN, AlN, and $Al_{0.5}Ga_{0.5}N$ as a function of the separation between the Fermi level and the valence band with substitutional Mg formation energies for the different growth processes indicated in the figure by their respective arrows. By increasing the separation between the Fermi level and valence band, the formation energy is reduced to only approximately 0.43 eV for metal-semiconductor junction assisted epitaxy of AlGaN.

Mg incorporation in AlGaN is enhanced by nearly one order of magnitude compared to a conventional growth process. For example, an Mg concentration of approximately $2 \times 10^{20}$ $cm^{-3}$ was measured in $Al_{0.75}Ga_{0.25}N$ for a moderate Mg flux of approximately $7 \times 10^{-8}$ Torr. A significant reduction of carbon impurity incorporation was also confirmed through detailed secondary ion mass spectrometry (SIMS) measurements. Significantly, a free hole concentration of approximately $4.5 \times 10^{17}$ $cm^{-3}$ was measured for $Al_{0.9}Ga_{0.1}N$, with resistivity values less than five Ω·cm, which is nearly three orders of magnitude lower compared to conventional techniques.

Figure 5A:
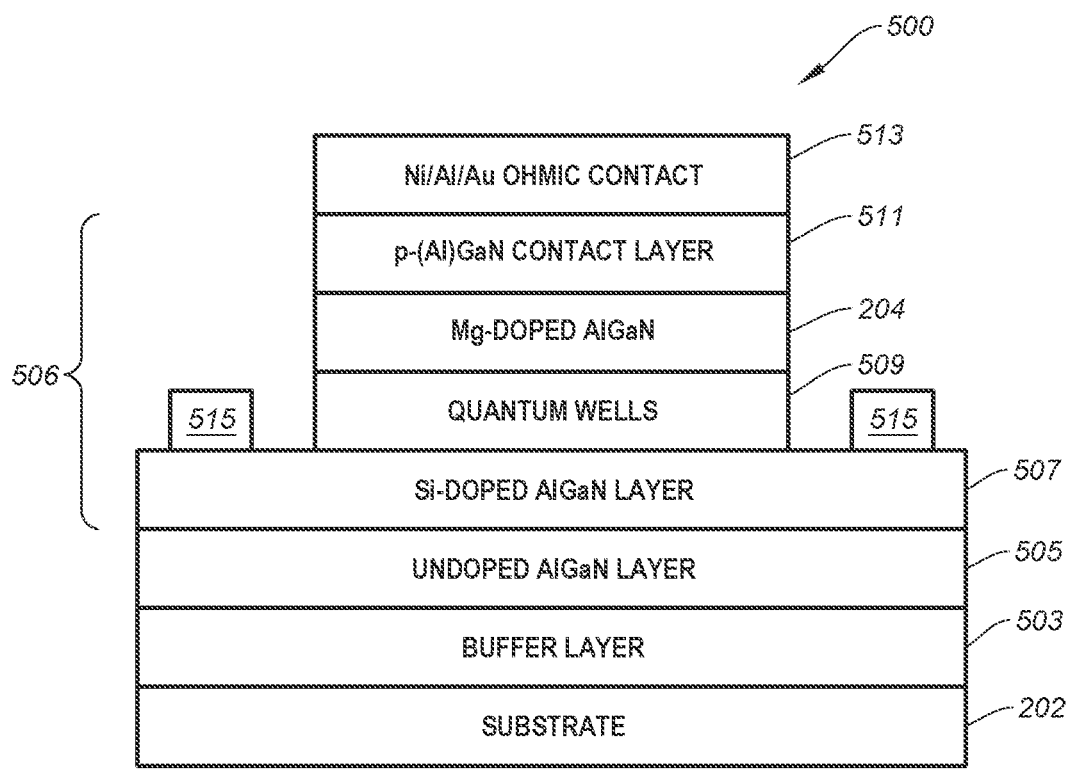
FIGS. 5A and 5B illustrate examples of devices that can be fabricated using metal-semiconductor junction assisted epitaxy in embodiments according to the present invention.
Figure 5B:
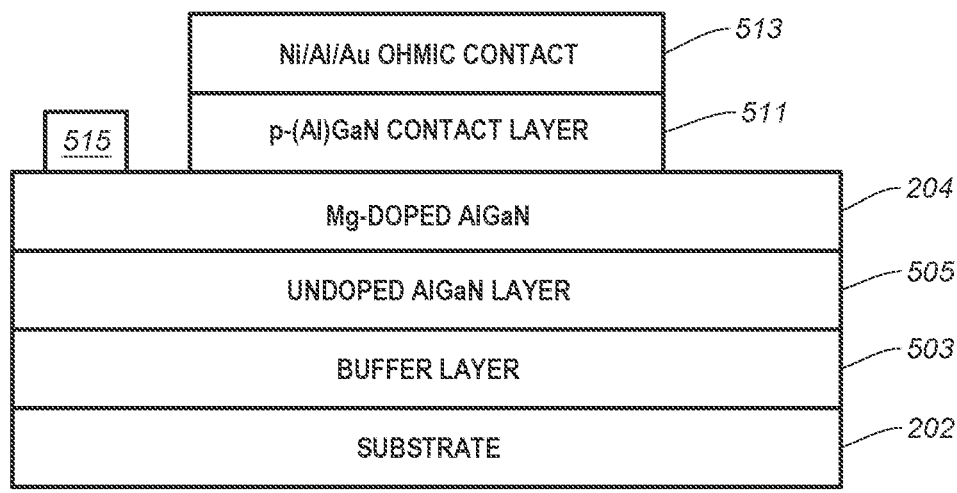
Figure 6A:
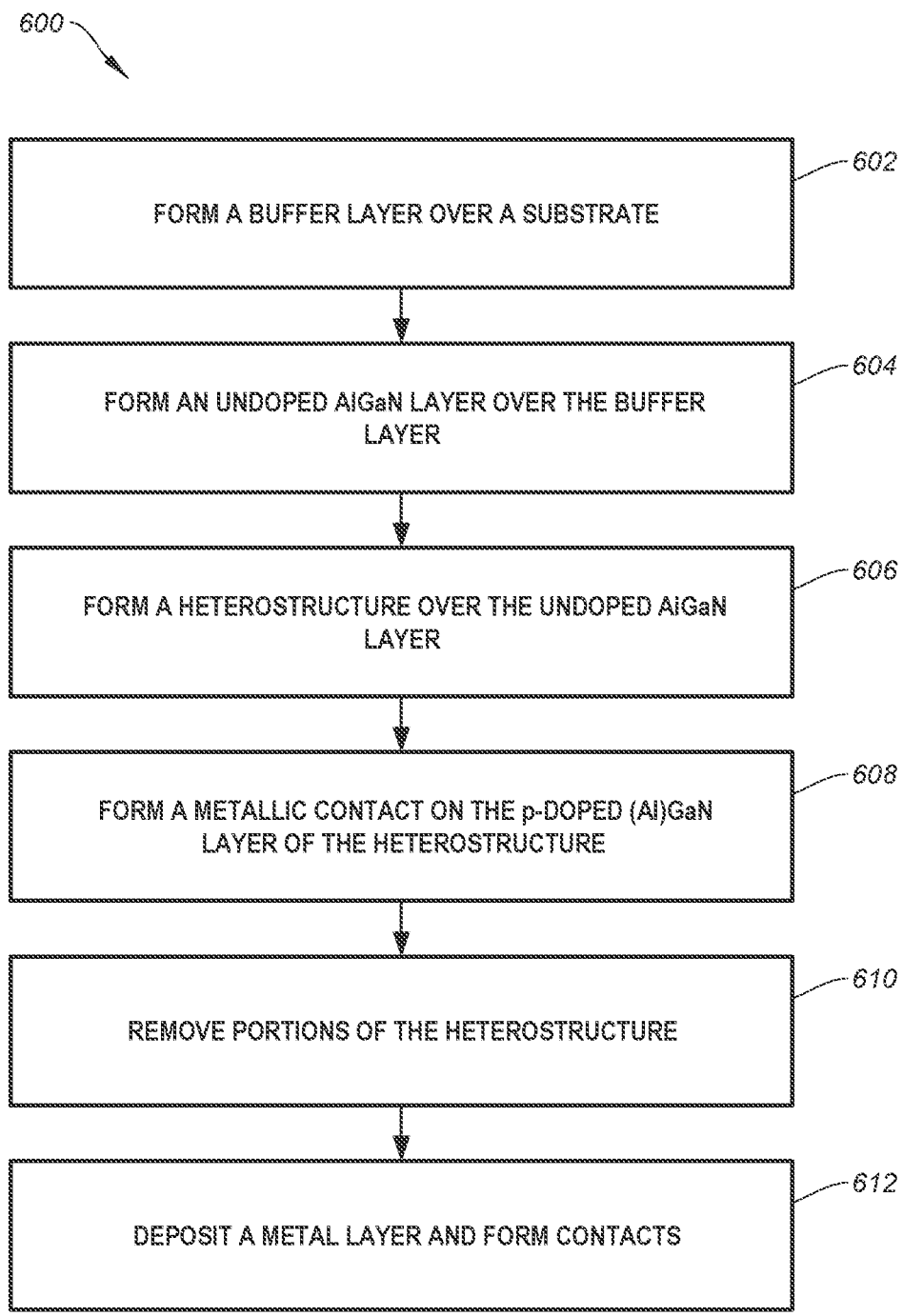
FIGS. 6A and 6B are flowcharts of methods of fabricating devices using metal-semiconductor junction assisted epitaxy in embodiments according to the present invention.
Figure 6B:
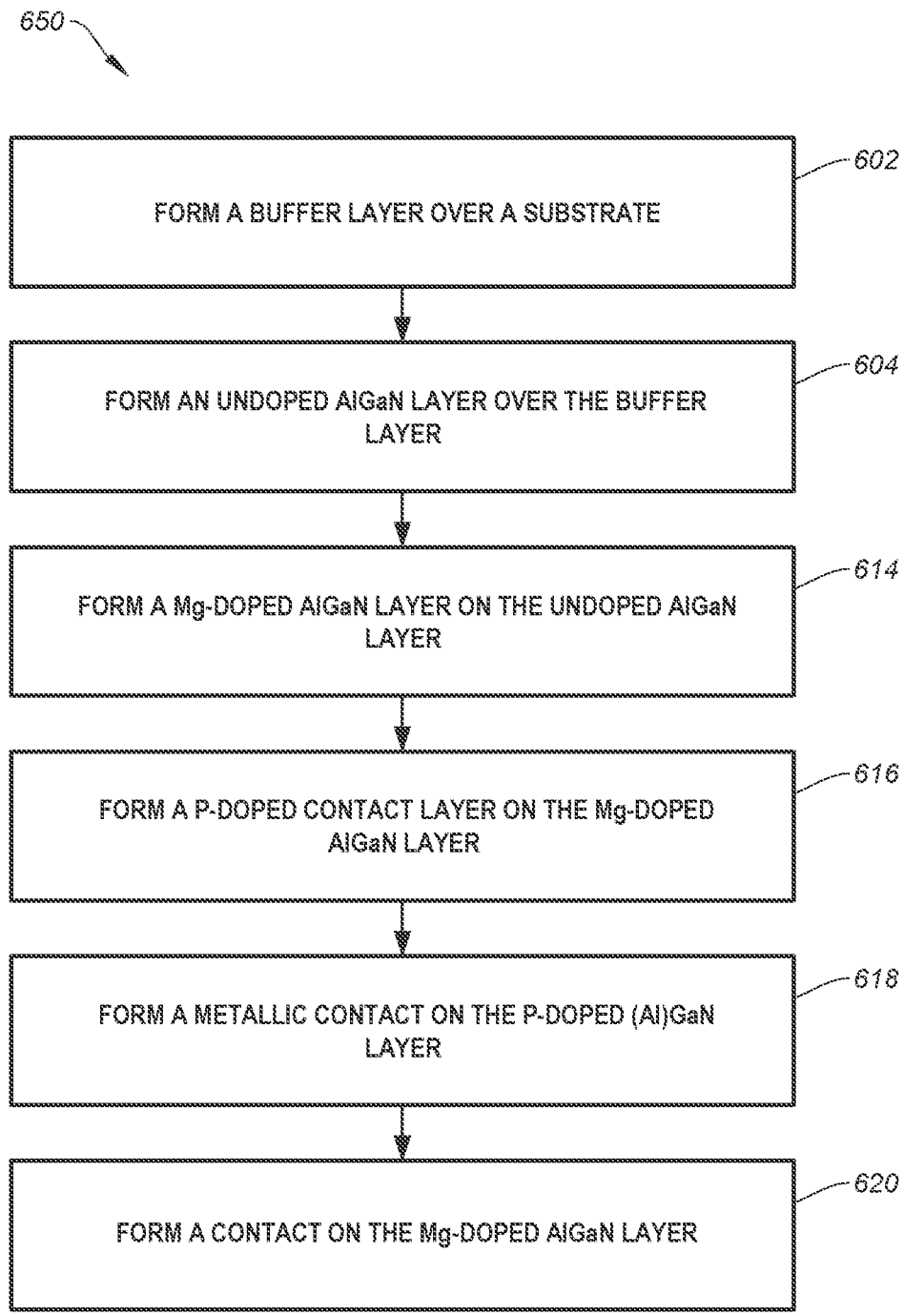

FIGS. 5A and 5B illustrate examples of devices that can be fabricated using metal-semiconductor junction assisted epitaxy in embodiments according to the present invention. FIG. 5A shows elements of an optoelectronic device 500, and FIG. 5B shows elements of a Schottky diode 510. FIGS. 6A and 6B are flowcharts 600 and 650, respectively, of methods of fabricating devices using metal-semiconductor junction assisted epitaxy in embodiments according to the present invention. In general, in these methods, MBE is used to form a liquid metal layer on the growth interface during epitaxy, to enhance dopant incorporation and curtail the formation of compensating defects.

In block 602 of FIGS. 6A and 6B, with reference also to FIGS. 5A and 5B, in an embodiment, an (un)doped (Al)GaN buffer layer 503 is formed over the substrate 202. The substrate 202 may be a sapphire substrate, although the invention is not so limited and other substrates can be used.

In block 604, in an embodiment, an undoped AlGaN layer 505 is formed over the AlN buffer layer 503.

In the embodiment of FIG. 5A, with reference to block 606 of FIG. 6A, a heterostructure 506 is formed above the undoped AlGaN layer 505. The heterostructure 506 includes a silicon (Si)-doped AlGaN layer 507, multiple (Al)GaN (AlGaN and/or GaN) quantum wells 509, the Mg-doped AlGaN layer 204, and a p-doped contact layer 511 (e.g., a p-doped GaN or AlGaN contact layer). As described above (in conjunction with FIGS. 1-3), the Mg-doped AlGaN layer 204 is formed by: depositing Mg, Al, Ga, and N in a layer using MBE, where excess Ga is produced during that depositing. The excess Ga forms a liquid Ga layer on the Mg-doped AlGaN layer during epitaxy of the Mg-doped AlGaN layer 204.

In an embodiment, the heterostructure 506 consists of a 250 nm thick Si-doped $Al_{0.7}Ga_{0.3}N$ layer, multiple $Al_{0.45}Ga_{0.55}N/Al_{0.7}Ga_{0.3}N$ quantum wells, a 60 nm thick Mg-doped AlGaN layer, and a three nm p-GaN contact layer. In an embodiment, the first (lower) half (e.g., the first 30 nm) of the Mg-doped AlGaN layer is graded from an Al composition of approximately 70% to 50% to make use of polarization-induced doping to maximize hole injection into the active region, and the second (upper) half (e.g., the second 30 nm) of that layer is Mg-doped $Al_{0.5}Ga_{0.5}N$. In an embodiment, an AlGaN electron blocking layer (not shown) is also incorporated to reduce electron overflow.

In an embodiment, the device active region is calibrated for emission at approximately 280 nm.

Continuing with reference to FIGS. 5A and 6A, a metallic (ohmic) contact 513 is formed on the p-doped (Al)GaN contact layer 511 in block 608. In an embodiment, the metallic contact 513 includes nickel (Ni), Al, and/or gold (Au); however, the invention is not so limited.

In block 610, portions of the heterostructure 506 (e.g., portions of the p-doped (Al)GaN contact layer 511, Mg-doped AlGaN layer 204, and (Al)GaN quantum wells 509) that are not covered by the metallic contact 513 are removed. For other types of devices, other layers of the heterostructure 506 can be removed.

In block 612, a metal layer is deposited in locations where the p-doped (Al)GaN contact layer 511, Mg-doped AlGaN layer 204, and quantum wells 509 are removed to form contacts 515 on the Si-doped AlGaN layer 507. In an embodiment, the metal layer includes titanium (Ti); however, the invention is not so limited.

In embodiments, an ultraviolet (UV) light emitting diode (LED) fabrication process includes the use of photolithography, dry etching, and contact metallization techniques. The device mesa has an area 50 μm×50 μm. A Ti (40 nm)/Al (120 nm)/Ni (40 nm)/Au (50 nm) metal stack is deposited on n-AlGaN and annealed at 750° C. for 30 seconds in nitrogen ambient to form a n-metal contact. A Ni (20 nm)/Al (100 nm)/Au (20 nm) metal stack is deposited on p-AlGaN and annealed at 500° C. for five minutes in air to form a p-metal contact.

With reference now to the embodiment of FIG. 5B, with reference also to block 614 of FIG. 6B, the Mg-doped AlGaN layer 204 is formed on the undoped AlGaN layer 505. As described above (in conjunction with FIGS. 1-3), the Mg-doped AlGaN layer 204 is formed by: depositing Mg, Al, Ga, and N in a layer using MBE, where excess Ga is produced during that depositing. The excess Ga forms a liquid Ga layer on the Mg-doped AlGaN layer during epitaxy of the Mg-doped AlGaN layer 204.

In block 616, the p-doped contact layer 511 (e.g., a p-doped GaN or AlGaN contact layer) is formed on the Mg-doped AlGaN layer 204.

In block 618, the metallic (ohmic) contact 513 is formed on the p-doped (Al)GaN contact layer 511.

In block 620, a contact 515 is formed on the Mg-doped AlGaN layer 204.

More specifically, in embodiments, for a Schottky diode 510 fabricated on the Mg-doped AlGaN layer 204, a metallic stack consisting of Ni (20 nm)/Al (100 nm)/Au (20 nm) is first deposited for the ohmic contact 513 and annealed at 500° C. for five minutes in the presence of air. The p-doped (Al)GaN layer 511 that was outside of the Ni/Al/Au metallic contact 513 is removed using a low-power plasma etch with $BCl_3/Cl_2$ chemistry. Then, a 200 nm thick Ti layer is deposited for the Schottky contact 515. In an embodiment, the area of the diode is 500 μm×500 μm.

Figure 7A:
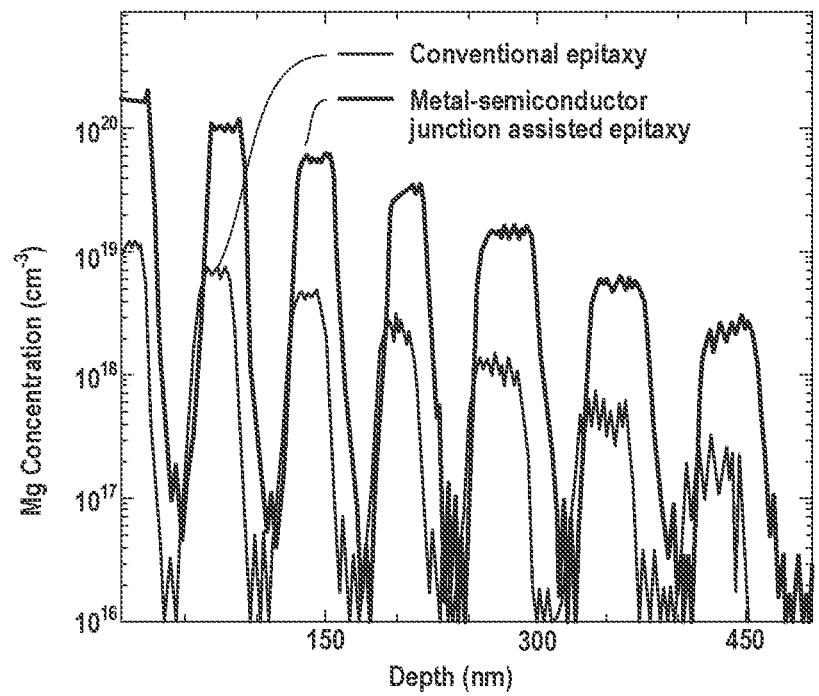
FIG. 7A shows the Mg atom concentration versus depth obtained from secondary ion mass spectrometry measurements on Mg-doped $Al_{0.75}Ga_{0.25}N$ grown using metal-semiconductor junction assisted epitaxy in embodiments according to the present invention and grown using conventional epitaxy.

FIG. 7A shows the Mg atom concentration versus depth obtained from SIMS measurements on Mg-doped $Al_{0.75}Ga_{0.25}N$ grown using metal-semiconductor junction assisted epitaxy and using conventional epitaxy. FIG. 7A shows the Mg atom concentration profile for two samples, in which the different Mg-doped AlGaN layers are separated by undoped layers. The first sample was grown under Ga-rich conditions, using metal-semiconductor junction assisted epitaxy, to ensure complete coverage of the substrate surface with metallic Ga during growth, while the second sample was grown under nearly stoichiometric conditions using a conventional growth mode but with otherwise identical conditions, e.g., the same growth rate and same Mg fluxes, for corresponding layers. Subsequently, Mg concentrations were obtained using SIMS measurements. It is seen that, with the use of metal-semiconductor junction assisted epitaxy, Mg concentrations are significantly higher than those grown using the conventional growth method.

Figure 7B:
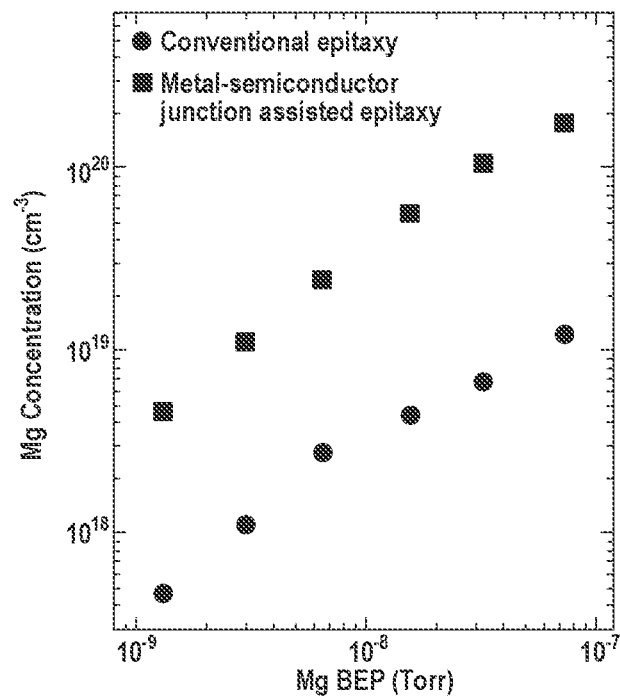
FIG. 7B shows the Mg concentration versus the Mg flux for Mg-doped $Al_{0.75}Ga_{0.25}N$ grown using metal-semiconductor junction assisted epitaxy in embodiments according to the present invention and grown using conventional epitaxy.

FIG. 7B shows the Mg concentration versus the Mg flux for Mg-doped $Al_{0.75}Ga_{0.25}N$ grown using metal-semiconductor junction assisted epitaxy and using conventional epitaxy. For both samples, Mg concentration increases with Mg beam equivalent pressure (BEP). However, the Mg atom density is over an order of magnitude higher for the sample grown with metal-semiconductor junction assisted epitaxy ("sample A"), as compared to the sample grown using a conventional process ("sample B"). The maximum Mg incorporation achieved for sample A was approximately $2 \times 10^{26}$ Mg atoms $cm^{-3}$, without showing any sign of saturation. The significantly enhanced Mg incorporation is attributed to the reduced formation energy for Al(Ga)-substitutional Mg incorporation when the Fermi level is pinned away from the valence band edge by utilizing the metal-semiconductor junction at the growth front.

Also, the carbon (C)-impurity concentration was significantly reduced using metal-semiconductor junction assisted epitaxy compared to metal-organic chemical vapor deposition (MOCVD). For the sample grown using metal-semiconductor junction assisted epitaxy, the carbon concentration is limited by the measurement background of SIMS (approximately $1 \times 10^{16}$ $cm^{-3}$). For comparison, carbon concentrations of approximately $5 \times 10^{16}$ $cm^{-3}$ to $2 \times 10^{18}$ $cm^{-3}$ have been commonly measured in Al-rich AlGaN grown by MOCVD.

The pinning of the Fermi level at the growth front through metal-semiconductor junction assisted epitaxy also leads to a significant decrease in the formation of point defects, which explains the observation that undoped (Al)GaN layers grown under Ga-rich conditions show approximately three orders of magnitude higher resistivity compared to films grown under conventional conditions.

Figure 7C:
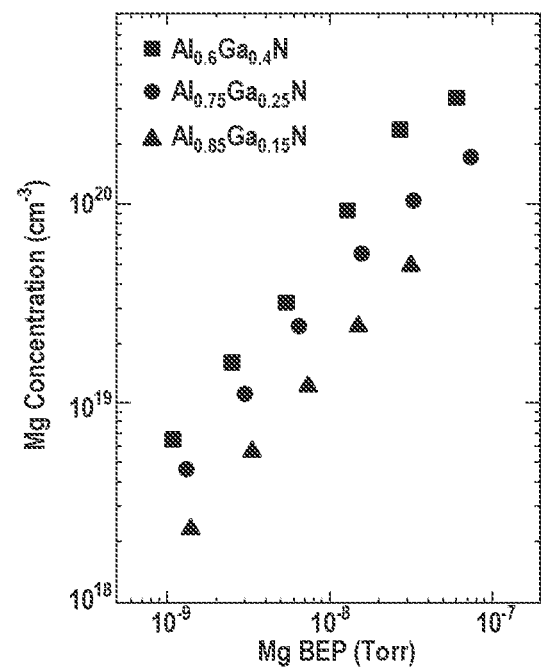
FIG. 7C shows the incorporated Mg concentration versus the Mg flux for samples grown with different Al compositions using metal-semiconductor junction assisted epitaxy in embodiments according to the present invention.

FIG. 7C shows the incorporated Mg concentration versus the Mg flux for samples grown with three different Al compositions (60%, 75%, and 85%). These samples were grown using metal-semiconductor junction assisted epitaxy to maximize Mg incorporation. For the same Mg flux used, a significant decrease in the Mg incorporation is observed with increasing Al composition of the alloy.

Figure 7D:
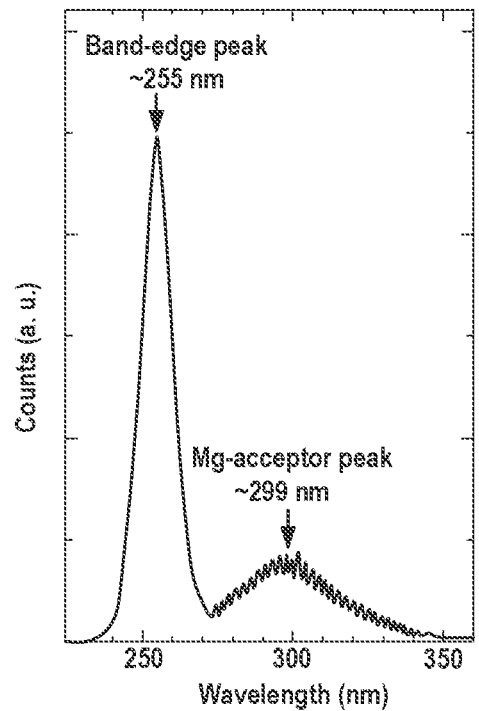
FIG. 7D shows photoluminescence spectra of a Mg-doped $Al_{0.75}Ga_{0.25}N$ sample grown using metal-semiconductor junction assisted epitaxy with band-edge peak and Mg-acceptor peaks in embodiments according to the present invention.

FIG. 7D shows photoluminescence spectra of a Mg-doped $Al_{0.75}Ga_{0.25}N$ sample grown using metal-semiconductor junction assisted epitaxy with band-edge peak and Mg-acceptor peaks shown with arrows in the figure. A strong peak near the band-edge at approximately 255 nm (4.86 eV) was measured, accompanied with the Mg-acceptor related transition at approximately 298 nm (4.16 eV). This emission originates from a donor-acceptor pair transition in Mg-doped AlGaN epilayers. The broad linewidth of the Mg-acceptor related transition and its partial overlap with the band-edge luminescence emission indicates a very large spread of the Mg-acceptor energy levels, extending nearly to the valence band edge of AlGaN.

Thus, the significantly enhanced Mg dopant incorporation can lead to the formation of an impurity band for hole hopping conduction, but more importantly, results in substantially reduced activation energies for a portion of Mg-dopants, thereby enabling the presence of large hole carrier concentrations at room temperature in AlGaN, that were not possible otherwise.

Figure 8A:
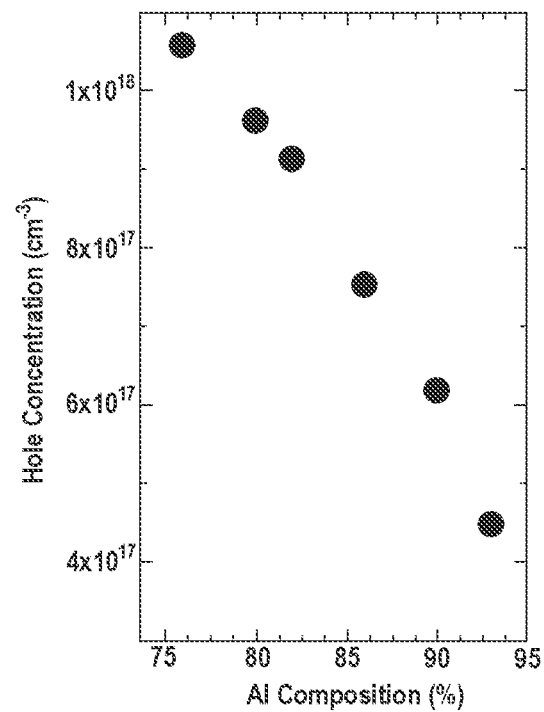
FIGS. 8A, 8B, 8C, and 8D show room-temperature Hall measurement data for Mg-doped AlGaN epilayers versus Al composition, respectively showing free hole concentration, hole mobility, resistivity, and resistivities of Mg-doped AlGaN layers in embodiments according to the present invention.
Figure 8B:
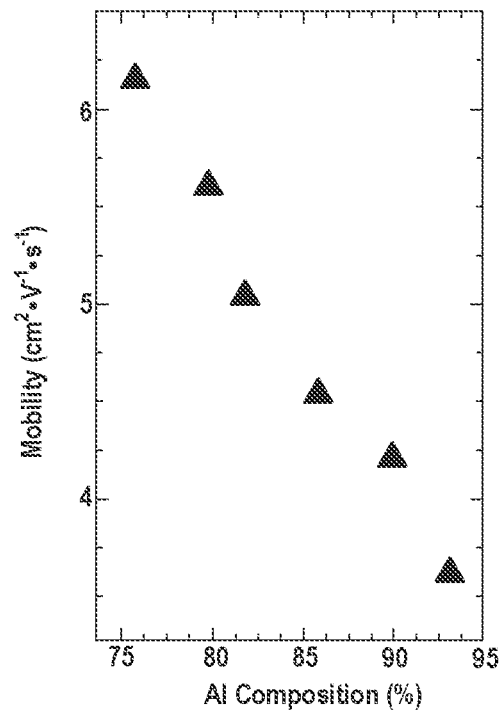
Figure 8C:
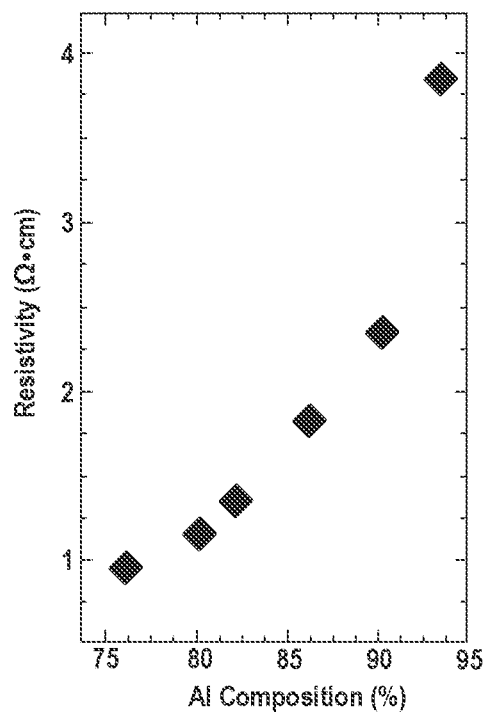
Figure 8D:
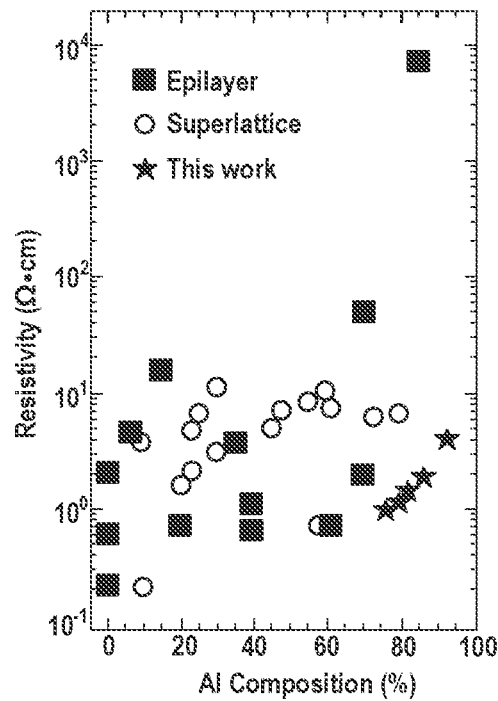

FIGS. 8A, 8B, 8C, and 8D show room-temperature Hall measurement data for Mg-doped AlGaN epilayers plotted against Al composition, respectively showing free hole concentration, hole mobility, resistivity, and resistivities of Mg-doped AlGaN layers in embodiments according to the present invention (labeled "this work" in FIG. 8D).

Metal-semiconductor junction assisted epitaxy was used to grow a series of Mg-doped samples with Al compositions varying from approximately 75% up to approximately 90%. Atomic force microscopy measurements indicated a smooth surface with roughness less than one nm for all the samples. Hall measurements were performed on the samples, using the van der Pauw method, to determine the hole concentration, hole mobility, and resistivity of the AlGaN layers for temperatures ranging from room temperature to 500° C. The room temperature hole concentration is observed to monotonically decrease with increasing Al content, illustrated in FIG. 8A.

FIG. 8B shows variations of hole mobility with the Al composition. The decrease in hole concentration and mobility with increasing Al composition can be explained by a reduction in Mg incorporation for alloys with a higher Al mole fraction due to the lower solubility of Mg and the increased formation enthalpy for Al-substitutional Mg. Even for the incorporated Mg atoms, the increase in the activation energy of the Mg-acceptor with increasing Al content further reduces the free hole concentration. This reduction in Mg concentration with increasing Al composition has been further verified through SIMS measurements of AlGaN samples grown with different alloy compositions, but with the same Mg BEP. These factors result in an increase in the resistivity for Mg-doped AlGaN layers with increased Al composition, shown in FIG. 8C. However even for $Al_{0.9}Ga_{0.1}N$, the measured resistivity remains below five $\Omega \cdot cm$.

The resistivity values of some previously reported Mg-doped AlGaN layers are plotted versus Al compositions in FIG. 8D, along with the resistivity of the AlGaN layers obtained using metal-semiconductor junction assisted epitaxy. It is seen that the resistivities of Mg-doped AlGaN grown using metal-semiconductor junction assisted epitaxy are nearly one to three orders of magnitude lower compared to previously reported results.

Figure 9A:
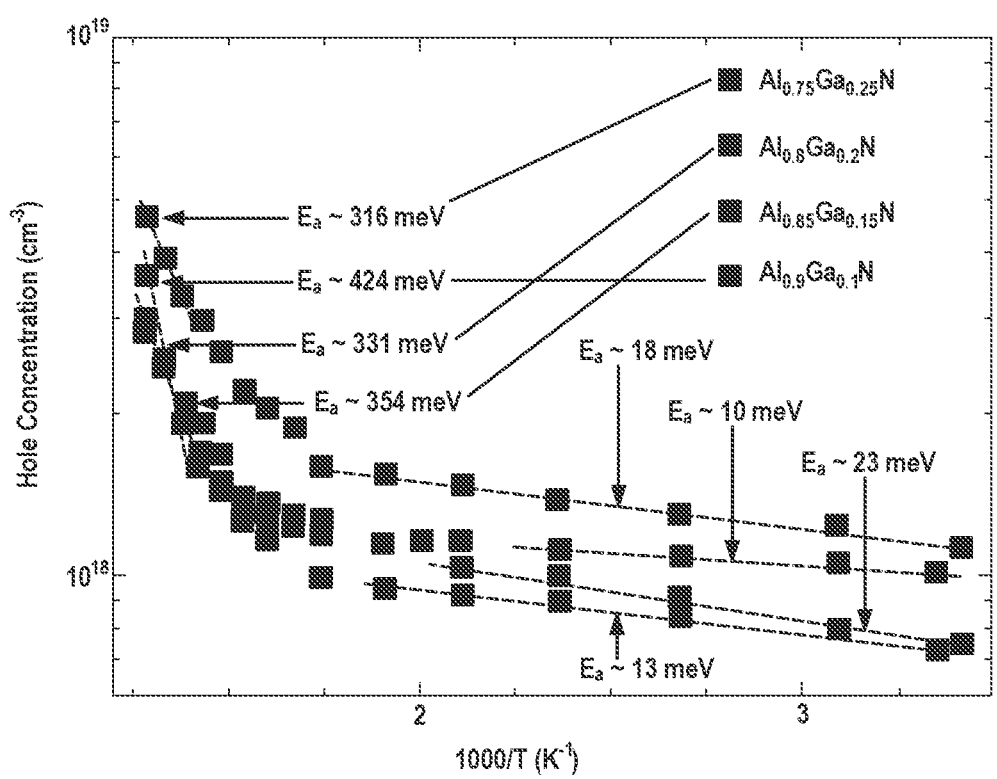
FIGS. 9A, 9B, and 9C show temperature-dependent Hall measurement of Mg-doped AlGaN epilayers grown by metal-semiconductor junction assisted epitaxy in embodiments according to the present invention, with Al content between 75% and 90%, for hole concentration, hole mobility, and resistivity, respectively, plotted against the inverse of temperature.
Figure 9B:
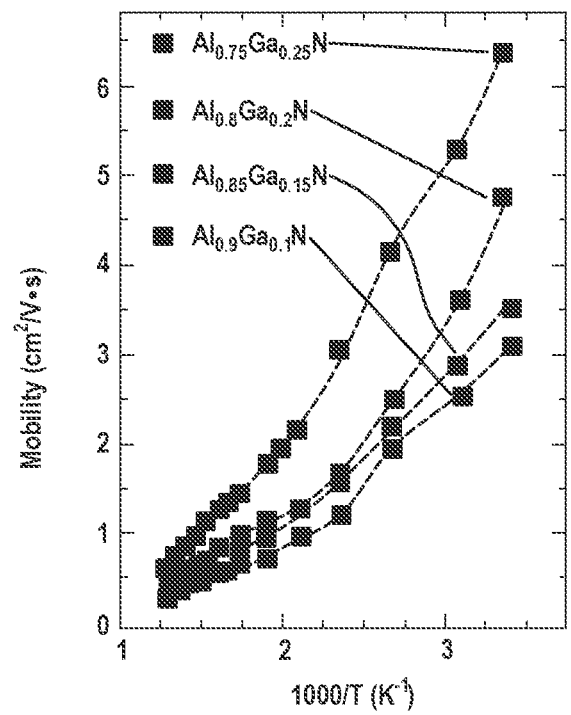
Figure 9C:
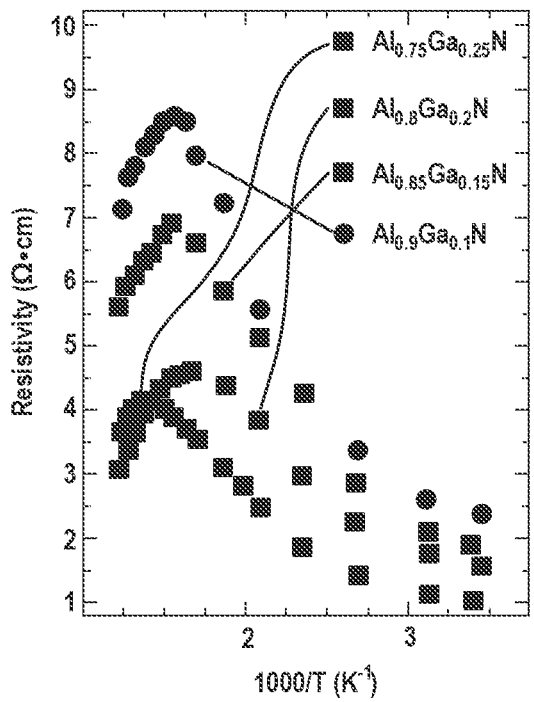

FIGS. 9A, 9B, and 9C show temperature-dependent Hall measurement of Mg-doped AlGaN epilayers grown by metal-semiconductor junction assisted epitaxy, with Al content between 75% and 90%, for hole concentration, hole mobility, and resistivity, respectively, plotted against the inverse of temperature.

With reference to FIG. 9A, a low activation energy (approximately 10-20 meV) at temperatures less than 600 K is seen in the samples, which is characteristic of hole hopping conduction in the impurity band, and can also be partly explained because a portion of the Mg dopants have significantly reduced activation energy, evidenced by the photoluminescence spectrum shown in FIG. 7D. At higher temperatures, more Mg-dopants get activated, contributing to holes in the valence band. This leads to a sharp increase in hole concentration at elevated temperatures (>650 K), which is characterized by a large activation energy (approximately 300-400 meV). Such activation energy values, however, are somewhat lower than those theoretically expected for AlGaN alloys with Al compositions of approximately 75-90%. This can be explained by the presence of band-tailing effects and the significantly broadened acceptor energy level distribution, which effectively reduces the activation energy for a portion of Mg-acceptors.

The measured hole mobility, shown in FIG. 9B, has a monotonically decreasing trend with increasing temperature, as expected due to an increase in phonon scattering.

The resistivity, shown in FIG. 9C, is first observed to increase with temperature between 300 K and approximately 650 K due to the decrease in hole mobility and the relatively small change in hole concentration. At higher temperatures, when the Mg acceptors get thermally activated, a dramatic rise in hole concentration results in the observed decrease in resistivity.

Figure 10A:
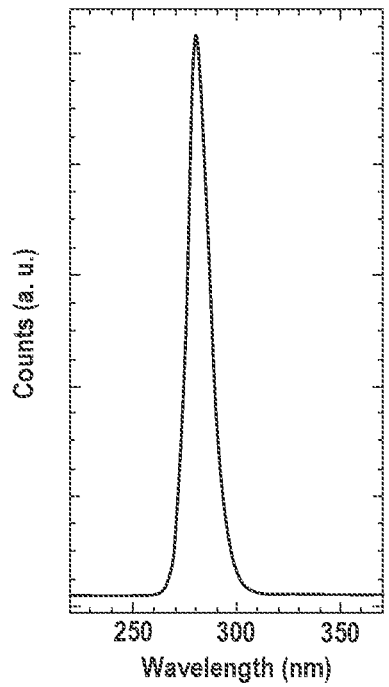
FIG. 10A shows electroluminescence spectrum for an ultraviolet light emitting diode (UV LED) grown using metal-semiconductor junction assisted epitaxy in embodiments according to the present invention.
Figure 10B:
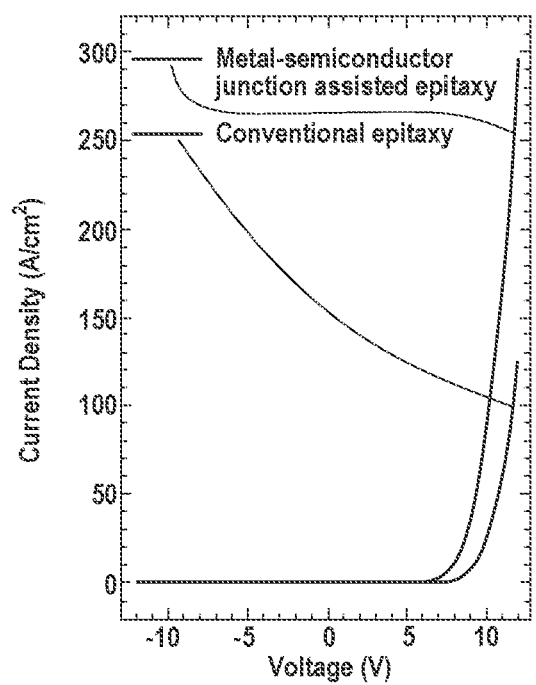
FIG. 10B shows current versus voltage characteristics for LEDs grown using metal-semiconductor junction assisted epitaxy in embodiments according to the present invention and grown using conventional epitaxy.
Figure 10C:
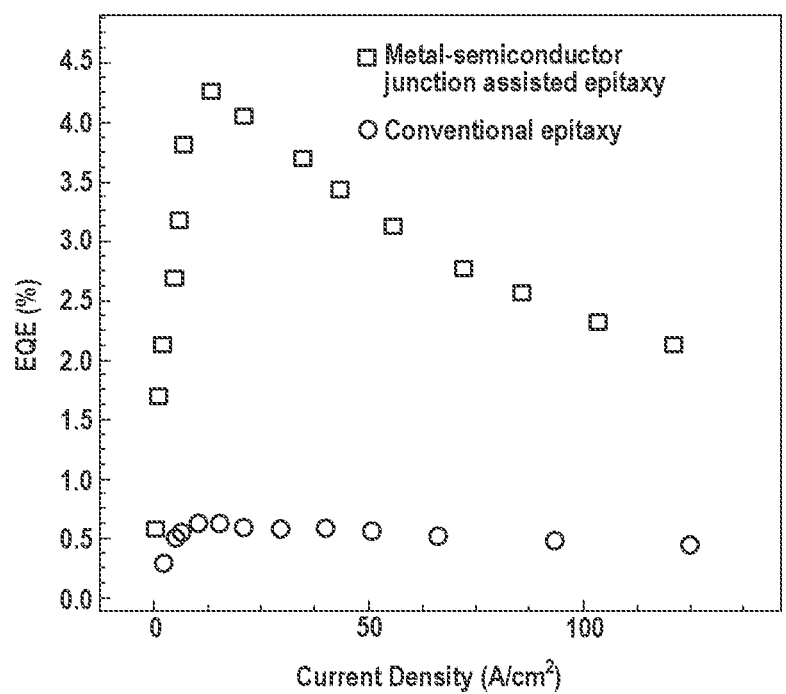
FIG. 10C shows external quantum efficiency versus current density for LEDs grown using metal-semiconductor junction assisted epitaxy in embodiments according to the present invention and grown using conventional epitaxy.

FIG. 10A shows electroluminescence spectrum for a UV LED grown using metal-semiconductor junction assisted epitaxy. FIG. 10B shows current versus voltage (I-V) characteristics for LEDs grown using metal-semiconductor junction assisted epitaxy and conventional epitaxy. FIG. 10C shows external quantum efficiency (EQE) versus current density for these devices.

The significantly reduced resistivity of Mg-doped AlGaN, enabled by metal-semiconductor junction assisted epitaxy, is important to improve the efficiency of optoelectronic devices operating in the mid and deep UV wavelengths. The device characteristics of AlGaN UV LEDs, emitting at approximately 280 nm, grown using metal-semiconductor junction assisted epitaxy, were compared with the device characteristics of identical LEDs grown using conventional epitaxy.

A typical electroluminescence spectrum is shown in FIG. 10A, with a narrow linewidth of approximately 11 nm. The current-voltage characteristic is shown in FIG. 10B, which exhibits a turn-on voltage of approximately seven volts for an LED grown using metal-semiconductor junction assisted epitaxy, while a turn-on voltage of approximately nine volts is seen for the conventional device. The higher turn-on voltage is likely a result of the ineffective Mg-doping when using conventional epitaxy. The EQE was further measured directly on the wafer, without any packaging, substrate removal, or cooling.

As shown in FIG. 10C, a maximum on-wafer EQE of approximately three percent was measured at room temperature for devices grown using metal-semiconductor junction assisted epitaxy, which is significantly better than that for devices grown using the conventional epitaxy process, which exhibit a maximum EQE of approximately 0.6%. This device performance is also better than other previously reported AlGaN UV LEDs grown by MBE around this wavelength. The improved device-characteristics seen in the samples grown using metal-semiconductor junction assisted epitaxy highlight the significance of efficient p-type conduction on device performance. It is also worth noting that the measured EQE can be significantly increased through proper packaging of devices to increase the light extraction efficiency, and by employing more comprehensive techniques to capture all the emitted light, such as the use of an integrating sphere.

In summary, by tuning the surface Fermi level using metal-semiconductor junction assisted epitaxy, efficient p-type conduction can be achieved for Al-rich AlGaN that was not previously possible. The presence of a metal-semiconductor interface at the growth front pins the Fermi level away from the valence band edge, which can significantly enhance Al(Ga)-substitutional Mg-dopant incorporation and further reduces the formation of compensating point defects. The presence of surface states, which are strongly affected by growth conditions as has been previously described for both polar and non-polar surfaces, may further play a role in pinning the Fermi level away from the valence band, although the surface state density structure at the elevated temperatures required for crystal growth has remained unknown. As such, large concentrations of Mg-acceptors can be incorporated in Al-rich AlGaN, which enables the formation of a Mg impurity band. Al-rich AlGaN epilayers, with resistivity values below one $\Omega \cdot cm$ for $Al_{0.75}Ga_{0.25}N$ and approximately four $\Omega \cdot cm$ for $Al_{0.9}Ga_{0.1}N$, have been measured, which are essential for achieving high efficiency mid and deep UV optoelectronic devices. Deep UV LEDs grown using metal-semiconductor junction assisted epitaxy show a great improvement in external quantum efficiency, and lower turn-on voltage, as compared to devices grown using conventional epitaxy. Metal-semiconductor junction assisted epitaxy can be further extended for the epitaxy/synthesis of a broad range of semiconductor nanostructures and heterostructures to achieve controlled dopant incorporation and to fundamentally improve their structural, electronic, and optical properties.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of fabricating a device, the method comprising:
using molecular beam epitaxy (MBE), depositing a p-type dopant, Group III elements, and a Group V element in a first layer above a substrate; and
forming a liquid metal layer on a growth interface of the first layer while the p-type dopant, the Group III elements, and the Group V element are being deposited in the layer, wherein the liquid metal layer is smooth and conformal across the first layer throughout said forming.

2. The method of claim 1, wherein:
said depositing comprises depositing magnesium (Mg), aluminum (Al), gallium (Ga), and nitrogen (N) in the first layer, to form by epitaxy a Mg-doped AlGaN layer; and
said forming comprises forming a liquid Ga layer on the Mg-doped AlGaN layer, wherein the liquid Ga layer causes formation of a metal-semiconductor junction during epitaxy of the Mg-doped AlGaN layer, and wherein the liquid Ga layer is smooth and conformal across the first layer throughout said forming.

3. The method of claim 2, further comprising, during the epitaxy of the Mg-doped AlGaN layer, controlling the Al composition by tuning Al flux and growth rate with N flow rate and allowing excess Ga to form a liquid metal layer on the surface of the Mg-doped AlGaN.

4. The method of claim 2, wherein the Mg-doped AlGaN layer comprises a portion of a light emitting diode (LED) heterostructure, wherein the LED heterostructure further comprises a silicon-doped AlGaN layer, a plurality of (Al)GaN quantum wells, and a p-doped contact layer.

5. The method of claim 2, further comprising, before the epitaxy of the Mg-doped AlGaN layer:
forming one or more layers over the substrate, wherein the one or more layers are selected from the group consisting of: an undoped AlN buffer layer; an undoped GaN layer; a doped GaN layer; an undoped AlGaN layer; and a doped AlGaN layer.

6. The method of claim 2, wherein the liquid Ga layer has a thickness of not less than five nanometers.

7. The method of claim 2, wherein the Al content in the Mg-doped AlGaN layer is at least 60 percent.

8. The method of claim 7, wherein the Mg-doped AlGaN layer has a free hole concentration of $4.5 \times 10^{17}$ per cubic centimeter with an Al content of 90 percent.

9. The method of claim 1, wherein the MBE is selected from the group consisting of: plasma-assisted MBE; and ammonia-based MBE.

10. The method of claim 1, further comprising:
depositing a buffer layer on the substrate;
forming an undoped aluminum (Al), gallium (Ga), and nitrogen (N) layer on the buffer layer; and
forming a doped AlGaN layer on the undoped AlGaN layer.

11. A method of fabricating a device, the method comprising:
forming a buffer layer over a substrate;
forming an undoped aluminum gallium nitride (AlGaN) layer over the buffer layer; and
forming one or more layers above the undoped AlGaN layer, the one or more layers comprising a magnesium (Mg)-doped AlGaN layer and a p-doped contact layer, wherein the Mg-doped AlGaN layer is formed by:
depositing Mg, Al, Ga, and N in a layer using molecular beam epitaxy (MBE), wherein excess Ga is provided during said depositing and forms a liquid Ga layer on the Mg-doped AlGaN layer, wherein the liquid Ga layer causes formation of a metal-semiconductor junction during epitaxy of the Mg-doped AlGaN layer, and wherein the liquid Ga layer is smooth and conformal across the Mg-doped AlGaN layer throughout said depositing.

12. The method of claim 11, further comprising, during the epitaxy of the Mg-doped AlGaN layer, controlling the Al composition by tuning Al flux and growth rate with N flow rate, to allow excess Ga to form a liquid metal layer on the surface of the Mg-doped AlGaN.

13. The method of claim 11, wherein the MBE is selected from the group consisting of: plasma-assisted MBE; and ammonia-based MBE.

14. The method of claim 11, wherein the Mg-doped AlGaN layer comprises a portion of a light emitting diode (LED) heterostructure, wherein the LED heterostructure further comprises a silicon (Si)-doped AlGaN layer and a plurality of (Al)GaN quantum wells.

15. The method of claim 14, further comprising forming metal contacts on the Si-doped AlGaN layer.

16. The method of claim 11, further comprising forming a metal contact on the Mg-doped AlGaN layer.

17. The method of claim 11, further comprising forming a metallic contact on the p-doped contact layer.

18. The method of claim 11, wherein the liquid Ga layer has a thickness of not less than five nanometers.

19. The method of claim 11, wherein the Al content in the Mg-doped AlGaN layer is at least 60 percent.

20. The method of claim 19, wherein the Mg-doped AlGaN layer has a free hole concentration of $4.5 \times 10^{17}$ per cubic centimeter with an Al content of 90 percent.

* * * * *